(12) United States Patent
Kage et al.

(10) Patent No.: US 8,632,946 B2
(45) Date of Patent: Jan. 21, 2014

(54) POSITIVE-TYPE PHOTORESIST COMPOSITION

(75) Inventors: Takakazu Kage, Ichihara (JP);
Norifumi Imaizumi, Ichihara (JP)

(73) Assignee: DIC Corporation, Tokyo (JP)

( * ) Notice: Subject to any disclaimer, the term of this patent is extended or adjusted under 35 U.S.C. 154(b) by 0 days.

(21) Appl. No.: 13/884,807

(22) PCT Filed: Oct. 25, 2011

(86) PCT No.: PCT/JP2011/074489
§ 371 (c)(1),
(2), (4) Date: May 10, 2013

(87) PCT Pub. No.: WO2012/063635
PCT Pub. Date: May 18, 2012

(65) Prior Publication Data
US 2013/0224655 A1 Aug. 29, 2013

(30) Foreign Application Priority Data
Nov. 10, 2010 (JP) .................................. 2010-251760

(51) Int. Cl.
*G03F 7/039* (2006.01)
(52) U.S. Cl.
USPC ........................................ 430/270.1; 430/905
(58) Field of Classification Search
None
See application file for complete search history.

(56) References Cited

U.S. PATENT DOCUMENTS

2003/0172828 A1* 9/2003 Tabuchi et al. ............. 101/463.1

FOREIGN PATENT DOCUMENTS

| JP | 60-159846 A | 8/1985 |
| JP | 11-258808 A | 9/1999 |
| JP | 2009-040899 A | 2/2009 |
| JP | 2010-039237 A | 2/2010 |
| WO | WO-2005-0101126 A1 | 10/2005 |

OTHER PUBLICATIONS

International Search Report dated Dec. 6, 2011, issued for PCT/JP2011/074489.

* cited by examiner

*Primary Examiner* — Sin J. Lee
(74) *Attorney, Agent, or Firm* — Edwards Wildman Palmer LLP

(57) ABSTRACT

Provided is a positive photoresist composition containing a cresol novolac resin (A) manufactured using m-cresol, p-cresol, and formaldehyde as essential raw materials and a novolac phenolic resin (B) manufactured using o-cresol, resorcinol, and formaldehyde as essential raw materials. This positive photoresist composition has high sensitivity and high heat resistance at the same time, which have so far been difficult to achieve at the same time, at a higher level and is suitable for use as a resist in, for example, the manufacture of semiconductor devices such as ICs and LSIs, which have required formation of finer patterns with the increasing packing density in recent years, the manufacture of displays such as LCDs, and the manufacture of printing plates.

16 Claims, No Drawings

POSITIVE-TYPE PHOTORESIST COMPOSITION

TECHNICAL FIELD

The present invention relates to positive photoresist compositions with high developability and heat resistance.

BACKGROUND ART

Positive photoresists containing an alkali-soluble resin and a photosensitizer such as 1,2-naphthoquinone diazide are known as resists for use in, for example, the manufacture of semiconductor devices such as ICs and LSIs, the manufacture of displays such as LCDs, and the manufacture of printing plates. One proposed positive photoresist composition contains a cresol novolac resin prepared from m-cresol and p-cresol as an alkali-soluble resin (see, for example, PTL 1).

Also proposed is a positive photoresist composition containing a cresol novolac resin prepared from m-cresol, p-cresol, and resorcinol as an alkali-soluble resin (see, for example, PTL 2).

Whereas the positive photoresist compositions disclosed in PTLs 1 and 2 are developed to provide high developability, e.g., high sensitivity, there is a need for a higher sensitivity because finer patterns have been used with the increasing packing density of semiconductor devices in recent years. Unfortunately, the positive photoresist composition disclosed in PTL 1 has insufficient sensitivity for use in forming such finer patterns. A need also exists for a higher heat resistance because semiconductor manufacturing processes, for example, involve various heat treatments. Unfortunately, the positive photoresist composition disclosed in PTL 1 has insufficient heat resistance.

One problem is that a novolac phenolic resin, which is an alkali-soluble resin, designed to have a higher alkali solubility so that it has a higher sensitivity exhibits a lower heat resistance, whereas a novolac phenolic resin designed to have a higher heat resistance exhibits a lower sensitivity, and this makes it difficult to achieve high sensitivity and high heat resistance at the same time. Accordingly, there is a need for a material that has high sensitivity and high heat resistance at the same time.

CITATION LIST

Patent Literature

PTL 1: Japanese Unexamined Patent Application Publication No. 60-159846
PTL 2: Japanese Unexamined Patent Application Publication No. 11-258808

SUMMARY OF INVENTION

Technical Problem

A problem to be solved by the present invention is to provide a positive photoresist composition that has high sensitivity and high heat resistance at the same time, which have so far been difficult to achieve at the same time, at a higher level.

Solution to Problem

After conducting extensive research, the inventors have found that a positive photoresist composition containing, as an alkali-soluble resin, a novolac phenolic resin manufactured using m-cresol, p-cresol, and formaldehyde as essential raw materials and, as a sensitivity improver, a novolac phenolic resin manufactured using o-cresol as an essential raw material and modified with resorcinol has high sensitivity and heat resistance, thus completing the present invention.

Specifically, the present invention relates to a positive photoresist composition containing a cresol novolac resin (A) manufactured using m-cresol, p-cresol, and formaldehyde as essential raw materials and a novolac phenolic resin (B) manufactured using o-cresol, resorcinol, and formaldehyde as essential raw materials.

Advantageous Effects of Invention

The positive photoresist composition of the present invention has high sensitivity and high heat resistance at the same time, which have so far been difficult to achieve at the same time, at a higher level and thus has extremely high sensitivity and heat resistance; therefore, it is suitable for use as a positive photoresist in, for example, the manufacture of semiconductor devices such as ICs and LSIs with finer patterns, the manufacture of displays such as LCDs, and the manufacture of printing plates.

DESCRIPTION OF EMBODIMENTS

A positive photoresist composition of the present invention contains a cresol novolac resin (A) manufactured using m-cresol, p-cresol, and formaldehyde as essential raw materials and a novolac phenolic resin (B) manufactured using o-cresol, resorcinol, and formaldehyde as essential raw materials.

The cresol novolac resin (A) will be described first. The cresol novolac resin (A) is a novolac phenolic resin prepared by condensing m-cresol, p-cresol, and formaldehyde as essential raw materials.

The molar ratio [m-cresol/p-cresol] of the m-cresol to the p-cresol used as essential raw materials for the cresol novolac resin (A) is preferably 10/0 to 2/8, more preferably 7/3 to 2/8, which allows high sensitivity and high heat resistance at the same time.

The m-cresol and p-cresol used as essential raw materials for the cresol novolac resin (A) may be used in combination with other phenolic compounds as raw materials. Examples of such phenolic compounds include phenol; o-cresol; xylenols such as 2,3-xylenol, 2,4-xylenol, 2,5-xylenol, 2,6-xylenol, 3,4-xylenol, and 3,5-xylenol; ethylphenols such as o-ethylphenol, m-ethylphenol, and p-ethylphenol; butylphenols such as isopropylphenol, butylphenol, and p-t-butylphenol; alkylphenols such as p-pentylphenol, p-octylphenol, p-nonylphenol, and p-cumylphenol; halogenated phenols such as fluorophenol, chlorophenol, bromophenol, and iodophenol; monosubstituted phenols such as p-phenylphenol, aminophenol, nitrophenol, dinitrophenol, and trinitrophenol; fused polycyclic phenols such as 1-naphthol and 2-naphthol; and polyhydric phenols such as resorcin, alkylresorcins, pyrogallol, catechol, alkylcatechols, hydroquinone, alkylhydroquinones, phloroglucin, bisphenol A, bisphenol F, bisphenol S, and dihydroxynaphthalene. These other phenolic compounds can be used alone or in combination. If m-cresol and p-cresol are used in combination with other phenolic compounds, the amount of other phenolic compounds used is preferably 0.05 to 1 mole per mole of the total amount of m-cresol and p-cresol.

The formaldehyde used as an essential raw material for the cresol novolac resin (A) may be used in combination with other aldehyde compounds as raw materials. Examples of such aldehyde compounds include paraformaldehyde, 1,3,5-trioxane, acetaldehyde, propionaldehyde, polyoxymethylene, chloral, hexamethylenetetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde, and salicylaldehyde. These aldehyde compounds can be used alone or in combination. Preferably, formaldehyde is used as a raw material for the cresol novolac resin (A), and formaldehyde may be used in combination with other aldehyde compounds. If formaldehyde is used in combination with other aldehyde compounds, the amount of other aldehyde compounds used is preferably 0.05 to 1 mole per mole of formaldehyde.

The condensation reaction of the phenolic compounds, including m-cresol and p-cresol, with the aldehyde compounds, including formaldehyde, in the manufacture of the cresol novolac resin (A) is preferably performed in the presence of an acid catalyst. Examples of acid catalysts include oxalic acid, sulfuric acid, hydrochloric acid, phenolsulfonic acid, paratoluenesulfonic acid, zinc acetate, and manganese acetate. These acid catalysts can be used alone or in combination. Among these acid catalysts, oxalic acid is preferred because it decomposes when heated and does not remain. The acid catalyst may be added before or during the reaction.

The molar ratio [(F)/(P)] of the aldehyde compounds (F) to the phenolic compounds (P) in the manufacture of the cresol novolac resin (A) is preferably 0.3 to 1.6, more preferably 0.5 to 1.3, which allows high sensitivity and heat resistance.

A specific example of a method for manufacturing the novolac phenolic resin (A) includes heating the phenolic compounds, the aldehyde compounds, and the acid catalyst to 60° C. to 140° C. to facilitate a polycondensation reaction and then removing water and the monomers under reduced pressure.

Next, the novolac phenolic resin (B) will be described. The novolac phenolic resin (B) is prepared by condensing o-cresol, resorcinol, and formaldehyde as essential raw materials.

Whereas the phenolic compound used as a raw material for the novolac phenolic resin (B) is o-cresol, it may be used in combination with other phenolic compounds. Examples of such phenolic compounds include phenol; o-cresol; xylenols such as 2,3-xylenol, 2,4-xylenol, 2,5-xylenol, 2,6-xylenol, 3,4-xylenol, and 3,5-xylenol; ethylphenols such as o-ethylphenol, m-ethylphenol, and p-ethylphenol; butylphenols such as isopropylphenol, butylphenol, and p-t-butylphenol; alkylphenols such as p-pentylphenol, p-octylphenol, p-nonylphenol, and p-cumylphenol; halogenated phenols such as fluorophenol, chlorophenol, bromophenol, and iodophenol; monosubstituted phenols such as p-phenylphenol, aminophenol, nitrophenol, dinitrophenol, and trinitrophenol; fused polycyclic phenols such as 1-naphthol and 2-naphthol; and polyhydric phenols such as resorcin, alkylresorcins, pyrogallol, catechol, alkylcatechols, hydroquinone, alkylhydroquinones, phloroglucin, bisphenol A, bisphenol F, bisphenol S, and dihydroxynaphthalene. These other phenolic compounds can be used alone or in combination. If o-cresol is used in combination with other phenolic compounds, the amount of other phenolic compounds used is preferably 0.05 to 1 mole per mole of the total amount of o-cresol.

Whereas the aldehyde compound used as a raw material for the novolac phenolic resin (B) is formaldehyde, it may be used in combination with other aldehyde compounds. Examples of such aldehydes include paraformaldehyde, trioxane, acetaldehyde, propionaldehyde, polyoxymethylene, chloral, hexamethylenetetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde, and salicylaldehyde. These aldehyde compounds can be used alone or in combination. If formaldehyde is used in combination with other aldehyde compounds, the amount of other aldehyde compounds used is preferably 0.05 to 1 mole per mole of formaldehyde.

The number of moles of the resorcinol per mole of the o-cresol used as raw materials for the novolac phenolic resin (B) is preferably 0.1 to 0.7 mole, more preferably 0.3 to 0.5 mole, which allows high sensitivity and high heat resistance at the same time.

The molar ratio [(F)/(P)] of the total number of moles of the aldehyde compounds (F), including formaldehyde and other optional aldehydes, to the total number of moles of the phenolic compounds (P), including o-cresol, resorcinol, and other optional phenolic compounds, is preferably 0.3 to 1.6, more preferably 0.5 to 1.3, which allows high sensitivity and heat resistance.

The novolac phenolic resin (B) is preferably manufactured by one of the following two methods of manufacture since the raw materials, i.e., o-cresol and resorcinol, have different reactivities with formaldehyde.

First Method of Manufacture: Two-Step Novolac Formation Reaction

This method of manufacture includes condensing o-cresol and other phenolic compounds with formaldehyde and other aldehyde compounds in the presence of an acid catalyst to cause novolac formation and then adding resorcinol to cause further novolac formation.

Second Method of Manufacture: Two-Step Resole and Novolac Formation Reaction

This method of manufacture includes the following first step (resole-forming step), second step (neutralizing and catalyst-removing step), and third step (novolac-forming step).

First Step o-Cresol and other phenolic compounds are condensed with formaldehyde and other aldehyde compounds by heating to 40° C. to 140° C. in the presence of an alkaline catalyst to prepare a resole phenolic resin (B').

Second Step

The novolac phenolic resin (B') prepared in the first step is neutralized with an acid. After separated water is removed, water is added, and a separated water layer is removed to remove the catalyst.

Third Step

Resorcinol, formaldehyde, other aldehyde compounds, and an acid catalyst are added to the novolac phenolic resin (B') from which the acid catalyst has been removed in the second step. The mixture is heated to 60° C. to 140° C. to facilitate a polycondensation reaction, and water and the monomers are then removed under reduced pressure to obtain a resorcinol-modified novolac phenolic resin (B).

Examples of alkaline catalysts used in the first manufacturing step include alkali metal hydroxides such as sodium hydroxide, lithium hydroxide, and potassium hydroxide; oxides and hydroxides of alkaline earth metals such as calcium, magnesium, and barium; primary amines such as ammonia and monoethanolamine; secondary amines such as diethanolamine; tertiary amines such as trimethylamine, triethylamine, triethanolamine, and diazabicycloundecene; and alkaline materials such as sodium carbonate and hexamethylenetetramine. These alkaline catalysts can be used alone or in combination. Among these alkaline catalysts, sodium hydroxide, potassium hydroxide, barium hydroxide, and calcium hydroxide are preferred for their high catalytic activities. The alkaline catalyst may be added before or during the reaction in the first manufacturing step.

Examples of acids used for neutralization in the second manufacturing step include sulfuric acid, oxalic acid, and hydrochloric acid. These acids can be used alone or in combination.

Examples of acid catalysts used in the third manufacturing step include oxalic acid, sulfuric acid, hydrochloric acid, phenolsulfonic acid, paratoluenesulfonic acid, zinc acetate, and manganese acetate. These acid catalysts can be used alone or in combination. Among these acid catalysts, oxalic acid is preferred because it decomposes thermally and does not remain. The acid catalyst may be added before or during the reaction in the third manufacturing step.

Among the above two methods for manufacturing the novolac phenolic resin (B), the second method of manufacture is preferred because o-cresol and resorcinol are more uniformly distributed in the novolac phenolic resin.

The cresol novolac resin (A) prepared by the method of manufacture described above preferably has a weight average molecular weight of 2,000 to 35,000, more preferably 5,000 to 20,000. The novolac phenolic resin (B) prepared by the methods of manufacture described above preferably has a weight average molecular weight of 500 to 4,000, more preferably 700 to 2,500. These weight average molecular weights are measured by gel permeation chromatography (GPC) under the following measurement conditions.

GPC Measurement Conditions

Measurement equipment: "HLC-8220 GPC" from Tosoh Corporation

Columns: "Shodex KF802" (8.0 mm ID×300 mm) from Showa Denko K.K.

+"Shodex KF802" (8.0 mm ID×300 mm) from Showa Denko K.K.

+"Shodex KF803" (8.0 mm ID×300 mm) from Showa Denko K.K.

+"Shodex KF804" (8.0 mm ID×300 mm) from Showa Denko K.K.

Column temperature: 40° C.

Detector: differential refractive index detector (R1)

Data processing: "GPC-8020 Model II version 4.30" from Tosoh Corporation

Developing solvent: tetrahydrofuran

Flow rate: 1.0 mL/min

Sample: microfiltered tetrahydrofuran solution with resin solid content of 0.5% by mass Injection volume: 0.1 mL Standards: monodisperse polystyrenes below Standards: Monodisperse Polystyrenes "A-500" from Tosoh Corporation "A-2500" from Tosoh Corporation "A-5000" from Tosoh Corporation "F-1" from Tosoh Corporation "F-2" from Tosoh Corporation "F-4" from Tosoh Corporation "F-10" from Tosoh Corporation "F-20" from Tosoh Corporation The positive photoresist composition of the present invention contains the cresol novolac resin (A) and the novolac phenolic resin (B) described above, and the content of the novolac phenolic resin (B) is preferably 3 to 60 parts by mass, more preferably 5 to 30 parts by mass, per 100 parts by mass of the cresol novolac resin (A), which allows high sensitivity and heat resistance.

In addition to the cresol novolac resin (A) and the novolac phenolic resin (B), the positive photoresist composition of the present invention usually contains a photosensitizer (C) and a solvent (D).

The photosensitizer (C) can be a quinone-diazide containing compound. Examples of quinone-diazide containing compounds include complete esters, partial esters, amides, and partial amides of polyhydroxybenzophenone compounds such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone, and 2,3,3',4,4',5'-hexahydroxybenzophenone; bis[(poly)hydroxyphenyl]alkane compounds such as bis(2,4-dihydroxyphenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-(2-(4-hydroxyphenyl)-2-propyl)phenyl]ethylidene}bisphenol, and 3,3'-dimethyl-{1-[4-(2-(3-methyl-4-hydroxyphenyl)-2-propyl)phenyl]ethylidene}bisphenol; tris(hydroxyphenyl)methanes and methyl-substituted derivatives thereof such as tris(4-hydroxyphenyl)methane, bis(4-hydroxy-3,5-dimethylphenyl)-4-hydroxyphenylmethane, bis(4-hydroxy-2,5-dimethylphenyl)-4-hydroxyphenylmethane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-2,5-dimethylphenyl)-3,4-dihydroxyphenylmethane, and bis(4-hydroxy-3,5-dimethylphenyl)-3,4-dihydroxyphenylmethane; and bis(cyclohexylhydroxyphenyl)(hydroxyphenyl)methanes and methyl-substituted derivatives thereof such as bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(5-cyclohexyl-4-hydroxy-2-methylphenyl)-2-hydroxyphenylmethane, bis(5-cyclohexyl-4-hydroxy-2-methylphenyl)-3-hydroxyphenylmethane, bis(5-cyclohexyl-4-hydroxy-2-methylphenyl)-4-hydroxyphenylmethane, bis(3-cyclohexyl-2-hydroxyphenyl)-3-hydroxyphenylmethane, bis(5-cyclohexyl-4-hydroxy-3-methylphenyl)-4-hydroxyphenylmethane, bis(5-cyclohexyl-4-hydroxy-3-methylphenyl)-3-hydroxyphenylmethane, bis(5-cyclohexyl-4-hydroxy-3-methylphenyl)-2-hydroxyphenylmethane, bis(3-cyclohexyl-2-hydroxyphenyl)-4-hydroxyphenylmethane, bis(3-cyclohexyl-2-hydroxyphenyl)-2-hydroxyphenylmethane, bis(5-cyclohexyl-2-hydroxy-4-methylphenyl)-2-hydroxyphenylmethane, and bis(5-cyclohexyl-2-hydroxy-4-methylphenyl)-4-hydroxyphenylmethane, with quinone-diazide containing sulfonic acids such as naphthoquinone-1,2-diazide-5-sulfonic acid, naphthoquinone-1,2-diazide-4-sulfonic acid, and ortho-anthraquinone diazide sulfonic acid. These photosensitizers can be used alone or in combination.

The content of the photosensitizer (C) in the positive photoresist composition of the present invention is preferably 3 to 50 parts by mass, more preferably 5 to 30 parts by mass, per 100 parts by mass of the total amount of cresol novolac resin (A) and novolac phenolic resin (B), which provides good sensitivity and allows formation of a desired pattern.

Examples of solvents (D) include ethylene glycol alkyl ethers such as ethylene glycol monomethyl ether, ethylene glycol monoethyl ether, ethylene glycol monopropyl ether, and ethylene glycol monobutyl ether; diethylene glycol dialkyl ethers such as diethylene glycol dimethyl ether, diethylene glycol diethyl ether, diethylene glycol dipropyl ether, and diethylene glycol dibutyl ether; ethylene glycol alkyl ether acetates such as methyl cellosolve acetate and ethyl cellosolve acetate; propylene glycol alkyl ether acetates such as propylene glycol monomethyl ether acetate, propylene glycol monoethyl ether acetate, and propylene glycol monopropyl ether acetate; ketones such as acetone, methyl ethyl ketone, cyclohexanone, and methyl amyl ketone; cyclic ethers such as dioxane; and esters such as methyl 2-hydroxypropionate, ethyl 2-hydroxypropionate, ethyl 2-hydroxy-2-methylpropionate, ethyl ethoxyacetate, ethyl oxyacetate, methyl 2-hydroxy-3-methylbutanoate, 3-methoxybutyl acetate, 3-methyl-3-methoxybutyl acetate, ethyl formate, ethyl acetate, butyl acetate, methyl acetoacetate, and ethyl acetoacetate. These solvents can be used alone or in combination.

The positive photoresist composition of the present invention preferably contains the solvent (D) in such an amount that the solid content concentration of the composition is 30% to 65% by mass, which provides sufficient flowability to form a uniform coating by a coating process such as spin coating.

In addition to the cresol novolac resin (A), the novolac phenolic resin (B), the photosensitizer (C), and the solvent (D), the positive photoresist composition of the present invention may contain various additives in such amounts as not to impair the advantages of the present invention. Examples of such additives include fillers, pigments, surfactants such as leveling agents, adhesion improvers, and dissolution accelerators.

The positive photoresist composition of the present invention can be prepared by mixing and stirring the cresol novolac resin (A), the novolac phenolic resin (B), the photosensitizer (C), the solvent (D), and optional various additives to homogeneity as usual.

If solid additives such as fillers and pigments are added to the positive photoresist composition of the present invention, they are preferably mixed and dispersed using a dispersing apparatus such as a dissolver, a homogenizer, or a three-roll mill. The composition can also be filtered through, for example, a mesh filter or a membrane filter to remove coarse particles and impurities.

After the positive photoresist composition of the present invention is exposed through a mask, the exposed portion exhibits increased solubility to alkali developers as a result of a structural change in the resin composition. Because the unexposed portion maintains low solubility to alkali developers, the solubility difference therebetween enables patterning by alkali development and thus allows the use of the positive photoresist composition as a resist material.

Examples of light sources for exposing the positive photoresist composition of the present invention include infrared light, visible light, ultraviolet light, far-ultraviolet light, X-rays, and electron beams. Among these light sources, ultraviolet light is preferred, and the G-line (436 nm) and the I-line (365 nm) are suitable.

Examples of alkali developers used for development after exposure include alkaline aqueous solutions of inorganic alkaline materials such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; and cyclic amines such as pyrrole and piperidine. These alkali developers may optionally contain, for example, alcohols and surfactants. The alkali concentration of the alkali developer is usually preferably 2% to 5% by mass, and a 2.38% by mass tetramethylammonium hydroxide aqueous solution is typically used.

EXAMPLES

The present invention is further illustrated by the following specific examples. The weight average molecular weights (Mw) of the resulting resins were measured under the following GPC measurement conditions.
GPC Measurement Conditions
  Measurement equipment: "HLC-8220 GPC" from Tosoh Corporation
  Columns: "Shodex KF802" (8.0 mm ID×300 mm) from Showa Denko K.K.
  +"Shodex KF802" (8.0 mm ID×300 mm) from Showa Denko K.K.
  +"Shodex KF803" (8.0 mm ID×300 mm) from Showa Denko K.K.
  +"Shodex KF804" (8.0 mm ID×300 mm) from Showa Denko K.K.
  Column temperature: 40° C.
  Detector: differential refractive index detector (R1)
  Data processing: "GPC-8020 Model II version 4.30" from Tosoh Corporation
  Developing solvent: tetrahydrofuran
  Flow rate: 1.0 mL/min
  Sample: microfiltered tetrahydrofuran solution with resin solid content of 0.5% by mass
  Injection volume: 0.1 mL
  Standards: monodisperse polystyrenes below
Standards: Monodisperse Polystyrenes
  "A-500" from Tosoh Corporation
  "A-2500" from Tosoh Corporation
  "A-5000" from Tosoh Corporation
  "F-1" from Tosoh Corporation
  "F-2" from Tosoh Corporation
  "F-4" from Tosoh Corporation
  "F-10" from Tosoh Corporation
  "F-20" from Tosoh Corporation Synthesis Example 1

A four-necked flask equipped with a stirrer and a thermometer was charged with 648 g of m-cresol, 432 g of p-cresol, 2.5 g of oxalic acid, and 492 g of 42% by mass formaldehyde aqueous solution, and the mixture was reacted by heating to 100° C. for 3 hours. The resulting product was then heated to 200° C. under reduced pressure to remove water and the monomers, which yielded a solid cresol novolac resin (A1) having a softening point of 145° C. and a weight average molecular weight (Mw) of 9,600.

Synthesis Example 2

A four-necked flask equipped with a stirrer and a thermometer was charged with 432 g of m-cresol, 648 g of p-cresol, 2.5 g of oxalic acid, and 506 g of 42% by mass formaldehyde aqueous solution, and the mixture was reacted by heating to 100° C. for 3 hours. The resulting product was then heated to 200° C. under reduced pressure to remove water and the monomers, which yielded a solid cresol novolac resin (A2)

having a softening point of 150° C. and a weight average molecular weight (Mw) of 10,500.

Synthesis Example 3

A four-necked flask equipped with a stirrer and a thermometer was charged with 780 g of m-cresol, 1,560 g of p-cresol, 260 g of resorcinol, 10.8 g of oxalic acid, and 1,070 g of 42% by mass formaldehyde aqueous solution, and the mixture was reacted by heating to 100° C. for 3 hours. The resulting product was then heated to 200° C. under reduced pressure to remove water and the monomers, which yielded a solid cresol novolac resin (A3) having a softening point of 150° C. and a weight average molecular weight (Mw) of 9,900.

Synthesis Example 4

A four-necked flask equipped with a stirrer and a thermometer was charged with 1,080 g of o-cresol, 54 g of Sodium hydroxide, and 615 g of 42% by mass formaldehyde aqueous solution, and the mixture was reacted by heating to 60° C. with stirring for 5 hours. The resulting product was then neutralized with dilute sulfuric acid. After separated water was removed, 375 g of water was added, and a separated water layer was removed to remove the catalyst.

The flask was then charged with 418 g of resorcinol, 2 g of oxalic acid, and 78 g of 42% by mass formaldehyde aqueous solution, and the mixture was reacted by heating to 100° C. for 1 hour. The resulting product was then heated to 170° C. to remove water and the monomers for 1 hour. The resulting product was then heated to 190° C. under reduced pressure to remove water and the monomers for 2 hours, which yielded a solid novolac phenolic resin (B1) having a softening point of 125° C. and a weight average molecular weight (Mw) of 1,700.

The cresol novolac resins (A1), (A2), and (A3) and the novolac phenolic resin (B1) obtained in Synthesis Examples 1 to 4 were used to prepare positive photoresist compositions as follows.

Example 1

A positive photoresist composition (1) was prepared by homogeneously mixing 16 parts by mass of the cresol novolac resin (A1) obtained in Synthesis Example 1, 4 parts by mass of the novolac phenolic resin (B1) obtained in Synthesis Example 4, 5 parts by mass of a photosensitizer ("P-200" from Toyo Gosei Co., Ltd.), and 75 parts by mass of a solvent (propylene glycol monomethyl acetate; hereinafter abbreviated as "PGMEA").

Example 2

A positive photoresist composition (2) was prepared by repeating the procedure of Example 1 except that the cresol novolac resin (A1) used in Example 1 was replaced by the novolac phenolic resin (A2) obtained in Synthesis Example 2.

Comparative Example 1

A positive photoresist composition (3) was prepared by homogeneously mixing 16 parts by mass of the novolac phenolic resin (A1) obtained in Synthesis Example 1, 5 parts by mass of a photosensitizer ("P-200" from Toyo Gosei Co., Ltd.), and 75 parts by mass of PGMEA.

Comparative Example 2

A positive photoresist composition (4) was prepared by repeating the procedure of Comparative Example 1 except that the cresol novolac resin (A1) used in Comparative Example 1 was replaced by the novolac phenolic resin (A2) obtained in Synthesis Example 2.

Comparative Example 3

A positive photoresist composition (5) was prepared by repeating the procedure of Comparative Example 1 except that the cresol novolac resin (A1) used in Comparative Example 1 was replaced by the novolac phenolic resin (A3) obtained in Synthesis Example 3.

Alkali Dissolution Rate Measurement and Sensitivity Evaluation

Positive photoresist compositions were prepared as in Examples 1 and 2 and Comparative Examples 1 to 3 above without adding a photosensitizer as compositions for sensitivity measurements. The compositions prepared for sensitivity measurements were applied to a silicon wafer with a diameter of 5 inches using a spin coater and was dried at 110° C. for 60 seconds to form a thin film with a thickness of 1 μm. The thin film was dipped in an alkaline solution (2.38% by mass tetramethylammonium hydroxide aqueous solution) for 60 seconds, and the thickness thereof after dipping was measured using a thickness meter ("F-20" from Filmetrics, Inc.) to determine the alkali dissolution rate (ADR). The sensitivity was evaluated from the resulting value according to the following scale:

A: The alkali dissolution rate was 20 nm/sec or higher.
B: The alkali dissolution rate was 10 nm/sec to lower than 20 nm/sec.
C: The alkali dissolution rate was lower than 10 nm/sec.

Thermogravimetry and Heat Resistance Evaluation

After the positive photoresist compositions obtained in Examples 1 and 2 and Comparative Examples 1 and 2 above were cured by heating at 130° C. for 30 minutes, thermogravimetry (TG) was performed to determine the inflection point where a sharp weight change occurred as the heat resistance temperature, and the heat resistance was evaluated according to the following scale:

A: The heat resistance temperature was 170° C. or higher.
B: The heat resistance temperature was 150° C. to lower than 170° C.
C: The heat resistance temperature was lower than 150° C.

Table 1 shows the evaluations of the positive photoresist compositions (1) to (5) obtained in Examples 1 and 2 and Comparative Examples 1 to 3.

TABLE 1

|  |  | Example 1 | Example 2 | Comparative Example 1 | Comparative Example 2 | Comparative Example 3 |
|---|---|---|---|---|---|---|
| Positive photoresist composition | | (1) | (2) | (3) | (4) | (5) |
| Components | Cresol novolac resin (A) | (A1) | (A2) | (A1) | (A2) | (A3) |
| | Novolac phenolic resin (B) | (B1) | (B1) | — | — | — |
| Evaluations | Alkali dissolution rate (ADR) (nm/sec) | 23.7 | 20.2 | 9.6 | 6.5 | 14.4 |

TABLE 1-continued

|  | Example 1 | Example 2 | Comparative Example 1 | Comparative Example 2 | Comparative Example 3 |
|---|---|---|---|---|---|
| Sensitivity | A | A | C | C | B |
| Heat resistance temperature (° C.) | 179 | 182 | 144 | 148 | 151 |
| Heat resistance | A | A | C | C | B |

The evaluations in Table 1 showed that the positive photoresist composition (1) of the present invention obtained in Example 1 had an extremely high alkali dissolution rate, i.e., 23.7 nm/sec, indicating that it has high sensitivity. The evaluations also showed that the positive photoresist composition (1) had an extremely high heat resistance temperature, i.e., 179° C., indicating that it also has high heat resistance.

The evaluations also showed that the positive photoresist composition (2) of the present invention obtained in Example 2 had an extremely high alkali dissolution rate, i.e., 20.2 nm/sec, indicating that it has high sensitivity, as does the positive photoresist composition (1) of Example 1. The evaluations also showed that the positive photoresist composition (2) had an extremely high heat resistance temperature, i.e., 182° C., indicating that it also has high heat resistance.

In contrast, the positive photoresist composition (3) of Comparative Example 1 is an example of a positive photoresist composition containing, as an alkali-soluble resin, a cresol novolac resin prepared using m-cresol and p-cresol as raw materials and not containing the novolac phenolic resin (B), which is an essential component of a positive photoresist composition of the present invention. The evaluations showed that the positive photoresist composition (3) had a low alkali dissolution rate, i.e., 9.6 nm/sec, indicating that it has insufficient sensitivity. The evaluations also showed that the positive photoresist composition (3) had a low heat resistance temperature, i.e., 144° C., indicating that it also has insufficient heat resistance.

The positive photoresist composition (4) of Comparative Example 2 is an example of a positive photoresist composition containing, as an alkali-soluble resin, a cresol novolac resin prepared using m-cresol and p-cresol as raw materials and not containing the novolac phenolic resin (B), which is an essential component of a positive photoresist composition of the present invention. The evaluations showed that the positive photoresist composition (4) had a low alkali dissolution rate, i.e., 6.5 nm/sec, indicating that it has insufficient sensitivity. The evaluations also showed that the positive photoresist composition (4) had a low heat resistance temperature, i.e., 148° C., indicating that it also has insufficient heat resistance.

The positive photoresist composition (5) of Comparative Example 3 is an example of a positive photoresist composition containing, as an alkali-soluble resin, a cresol novolac resin prepared using m-cresol, p-cresol, and resorcinol as raw materials and not containing the novolac phenolic resin (B), which is an essential component of a positive photoresist composition of the present invention. The evaluations showed that the positive photoresist composition (5) had a low alkali dissolution rate, i.e., 14.4 nm/sec, indicating that it has insufficient sensitivity. The evaluations also showed that the positive photoresist composition (5) had a low heat resistance temperature, i.e., 151° C., indicating that it also has insufficient heat resistance.

The invention claimed is:

1. A positive photoresist composition containing a cresol novolac resin (A) manufactured using m-cresol, p-cresol, and formaldehyde as essential raw materials and a novolac phenolic resin (B) manufactured using o-cresol, resorcinol, and formaldehyde as essential raw materials.

2. The positive photoresist composition according to claim 1, wherein the number of moles of the resorcinol used as a raw material for the novolac phenolic resin (B) is 0.05 to 1 mole per mole of the o-cresol.

3. The positive photoresist composition according to claim 2, wherein the novolac phenolic resin (B) has a weight average molecular weight of 500 to 4,000.

4. The positive photoresist composition according to claim 3, wherein the novolac phenolic resin (B) is prepared by condensing o-cresol with formaldehyde in the presence of an alkaline catalyst to prepare a resole phenolic resin (B'), neutralizing the resin (B'), and condensing the resin (B') with resorcinol and formaldehyde in the presence of an acid catalyst.

5. The positive photoresist composition according to claim 4, wherein the content of the novolac phenolic resin (B) is 3 to 60 parts by mass per 100 parts by mass of the novolac phenolic resin (A).

6. The positive photoresist composition according to claim 3, wherein the content of the novolac phenolic resin (B) is 3 to 60 parts by mass per 100 parts by mass of the novolac phenolic resin (A).

7. The positive photoresist composition according to claim 2, wherein the novolac phenolic resin (B) is prepared by condensing o-cresol with formaldehyde in the presence of an alkaline catalyst to prepare a resole phenolic resin (B'), neutralizing the resin (B'), and condensing the resin (B') with resorcinol and formaldehyde in the presence of an acid catalyst.

8. The positive photoresist composition according to claim 7, wherein the content of the novolac phenolic resin (B) is 3 to 60 parts by mass per 100 parts by mass of the novolac phenolic resin (A).

9. The positive photoresist composition according to claim 2, wherein the content of the novolac phenolic resin (B) is 3 to 60 parts by mass per 100 parts by mass of the novolac phenolic resin (A).

10. The positive photoresist composition according to claim 1, wherein the novolac phenolic resin (B) has a weight average molecular weight of 500 to 4,000.

11. The positive photoresist composition according to claim 10, wherein the novolac phenolic resin (B) is prepared by condensing o-cresol with formaldehyde in the presence of an alkaline catalyst to prepare a resole phenolic resin (B'), neutralizing the resin (B'), and condensing the resin (B') with resorcinol and formaldehyde in the presence of an acid catalyst.

12. The positive photoresist composition according to claim 11, wherein the content of the novolac phenolic resin (B) is 3 to 60 parts by mass per 100 parts by mass of the novolac phenolic resin (A).

13. The positive photoresist composition according to claim 10, wherein the content of the novolac phenolic resin (B) is 3 to 60 parts by mass per 100 parts by mass of the novolac phenolic resin (A).

14. The positive photoresist composition according to claim 1, wherein the novolac phenolic resin (B) is prepared by condensing o-cresol with formaldehyde in the presence of an alkaline catalyst to prepare a resole phenolic resin (B'), neutralizing the resin (B'), and condensing the resin (B') with resorcinol and formaldehyde in the presence of an acid catalyst.

15. The positive photoresist composition according to claim 14, wherein the content of the novolac phenolic resin (B) is 3 to 60 parts by mass per 100 parts by mass of the novolac phenolic resin (A).

16. The positive photoresist composition according to claim 1, wherein the content of the novolac phenolic resin (B) is 3 to 60 parts by mass per 100 parts by mass of the novolac phenolic resin (A).

* * * * *